United States Patent
Geske et al.

(10) Patent No.: US 10,651,934 B2
(45) Date of Patent: May 12, 2020

(54) SYSTEM AND METHOD OF MITIGATING ELECTROMAGNETIC INTERFERENCE (EMI) IN MODULATED LIGHT DETECTION SYSTEMS

(71) Applicant: Attollo Engineering, LLC, Camarillo, CA (US)

(72) Inventors: Jonathan Geske, Ventura, CA (US); Andrew Hood, Ventura, CA (US)

(73) Assignee: Attollo Engineering, LLC, Camarillo, CA (US)

( * ) Notice: Subject to any disclaimer, the term of this patent is extended or adjusted under 35 U.S.C. 154(b) by 0 days.

(21) Appl. No.: 16/137,484

(22) Filed: Sep. 20, 2018

(65) Prior Publication Data

US 2020/0096621 A1   Mar. 26, 2020

(51) Int. Cl.
| | |
|---|---|
| *H04J 14/06* | (2006.01) |
| *H04B 10/116* | (2013.01) |
| *H04B 10/60* | (2013.01) |
| *G06F 3/041* | (2006.01) |
| *G06F 3/044* | (2006.01) |
| *H04B 10/54* | (2013.01) |
| *H04B 10/61* | (2013.01) |
| *H04B 10/40* | (2013.01) |
| *H04J 14/02* | (2006.01) |

(52) U.S. Cl.
CPC ........ *H04B 10/116* (2013.01); *G06F 3/044* (2013.01); *G06F 3/0416* (2013.01); *H04B 10/40* (2013.01); *H04B 10/541* (2013.01); *H04B 10/60* (2013.01); *H04B 10/61* (2013.01); *H04J 14/02* (2013.01); *H04J 14/06* (2013.01); *H01L 2224/48227* (2013.01); *H01L 2924/00* (2013.01)

(58) Field of Classification Search
CPC combination set(s) only.
See application file for complete search history.

(56) References Cited

U.S. PATENT DOCUMENTS

| | | | |
|---|---|---|---|
| 2006/0178157 A1* | 8/2006 | Gebara ................ | H04B 1/123 455/501 |
| 2013/0094668 A1* | 4/2013 | Poulsen ............... | H03G 3/301 381/107 |

(Continued)

OTHER PUBLICATIONS

Mitigation of Optical Background Noise in Light-Emitting Diode (LED) Optical Wireless Communication Systems, IEEE Photonics Journal, vol. 5, No. 1, Feb. 2013,C. W. Chow, C. H. Yeh, Y. F. Liu,and P. Y. Huang,pp. 1-5.*

(Continued)

*Primary Examiner* — Omar S Ismail
(74) *Attorney, Agent, or Firm* — Billion & Armitage; Michael A. Collins

(57) ABSTRACT

A modulated light receiver includes a photo-sensitive element, an electromagnetic interference (EMI) detection circuit, and a decision-making controller. The photo-sensitive element is configured to generate an electrical signal in response to modulated light. The electromagnetic interference (EMI) detection circuit is configured to generate an electrical signal in response to EMI. The decision-making controller is electrically coupled to the photo-sensitive element and the EMI detection circuit, wherein the decision-making controller generates an output based on the inputs received from the photo-sensitive element and the EMI detection circuit.

19 Claims, 12 Drawing Sheets

(56) References Cited

U.S. PATENT DOCUMENTS

| | | | | |
|---|---|---|---|---|
| 2014/0367556 A1* | 12/2014 | Lichtenegger | ........ | G01J 1/4228 250/214 A |
| 2015/0065055 A1* | 3/2015 | Newham | ........... | H04W 52/0251 455/41.3 |
| 2016/0378190 A1* | 12/2016 | Park | ...................... | G06F 3/0346 345/173 |
| 2017/0149474 A1* | 5/2017 | Kim | .................... | H04B 1/3888 |
| 2018/0123688 A1* | 5/2018 | Swoboda | ............. | H04B 1/0007 |

OTHER PUBLICATIONS

Mitigating_EMI_Signal_Injection_Attacks, IEEE Symposium on Security and Privacy,2013,Denis Foo Kune, John Backesy, Shane S . Clarkz,pp. 145-154.*

* cited by examiner

SYSTEM AND METHOD OF MITIGATING ELECTROMAGNETIC INTERFERENCE (EMI) IN MODULATED LIGHT DETECTION SYSTEMS

TECHNICAL FIELD

The invention relates generally to modulated light detection systems, and in particular to a systems and methods of mitigating EMI in modulated light detection systems.

BACKGROUND

Modulated light detection systems are utilized to detect modulated light such as lasers. For example, modulated light detection systems may include laser imaging receiver, laser radar receivers, laser event detection receivers, laser warning receivers, 3D imagers utilizing pulsed LEDs and pulsed lasers. In general, modulated light detection systems detect light and generate an output in response to detected light. However, one of the problems associated with modulated light detection systems is electromagnetic interference (EMI) generating electrical responses within the modulated light detection system that is incorrectly identified as a modulated light by the modulated light detection system.

SUMMARY

According to some embodiments, a modulated light receiver includes a photo-sensitive element, an electromagnetic interference (EMI) detection circuit, and a decision-making controller. The photo-sensitive element is configured to generate an electrical signal in response to modulated light. The electromagnetic interference (EMI) detection circuit is configured to generate an electrical signal in response to EMI. The decision-making controller is electrically coupled to the photo-sensitive element and the EMI detection circuit, wherein the decision-making controller generates an output based on the inputs received from the photo-sensitive element and the EMI detection circuit.

In another embodiment, a laser warning receiver system includes a detection system and an output device. The detection system includes a modulated light detection circuit and an electromagnetic interference (EMI) detection circuit. The output device is connected to the modulated light detector, wherein in response to modulated light detected by the modulated light detection circuit an output is generated at the output device and wherein in response to EMI detected by the EMI detection circuit the output is modified.

DETAILED DESCRIPTION

The present disclosure provides a system and method of mitigating EMI in modulated light detection systems. In general, a modulated light detection system is configured to detect modulated light, and may include one or more circuit components (e.g., photodiodes, signal conditioning circuits, etc.) that generate an electrical response to the incoming modulated light. The modulated light detection system may include one or more elements designed to shield and/or filter unwanted elements such as background light and/or other sources of electromagnetic interference (EMI). Despite utilization of shielding and filtering techniques, EMI is difficult/impossible to totally prevent from entering the signal chain associated with the detection of modulated light, wherein EMI can result in the undesirable generation of an electrical response that is interpreted as a modulated light input. In some embodiments, an EMI mitigation/detection circuit is utilized to detect EMI signals that may result in the inadvertent generation of an electrical response. In response to a detected EMI signal, an output is generated that can be utilized to negate the generation of the modulated light response and/or to provide an indication that the modulated light response may be unreliable.

Figure 1:
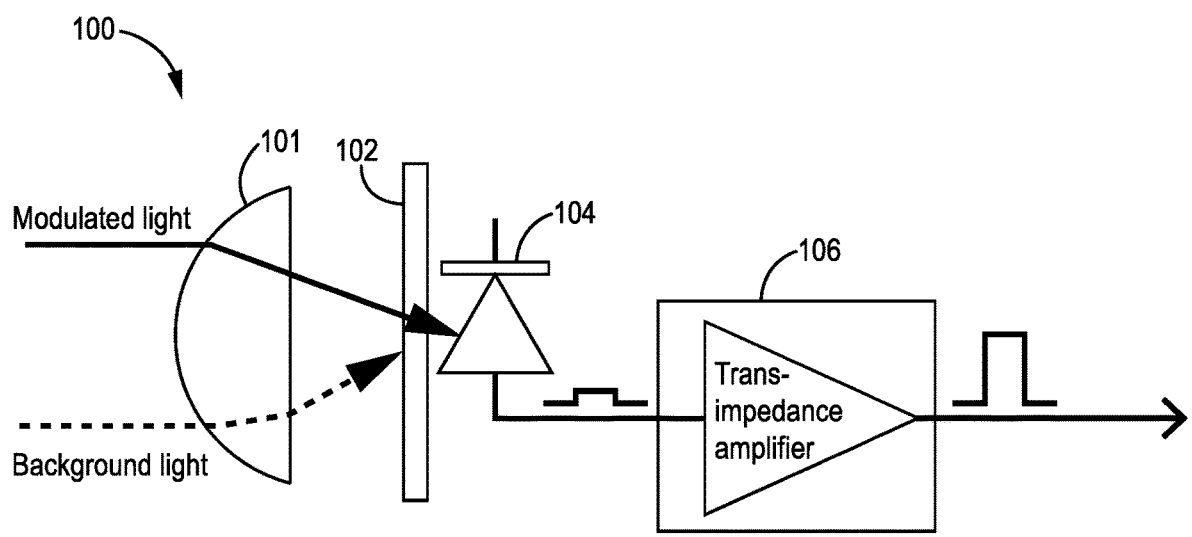
FIG. 1 is a simple view of a modulated light detection system as known in the prior art.

FIG. 1 is a simple view of a modulated light detection system as known in the prior art. The modulated light detection system 100 includes optical collector 101, filter 102, photo-sensitive element 104, and signal conditioning circuit 106. In general, modulated light detection system 100 is utilized to detect modulated light sources, which may include light sources generated by one or more of Super luminescent Light Emitting Diodes (SLEDs), light-emitting diodes (LEDs), laser diodes, vertical-cavity surface-emitting laser (VCSELs), solid-state lasers, and fiber lasers. Modulated light detection system 100 may be utilized in a number of applications, ranging but not limited to mobile phones, gaming systems, autonomous and semi-autonomous ground and aerial vehicles, military laser warning and event detection systems. Depending on the application the modulated light detection system 100 may be implemented as part of a sensor utilized to initiate a response based on the timing, position, shape, direction, or frequency content of the modulated light received.

In the embodiment shown in FIG. 1, light—including both background light 110 and modulated light 112—is provided via a focusing lens 108 to filter 102, which acts to filter out or remove background light 110 and/or other sources of unwanted light. The modulated light 112 is provided to light detector 104, which generates an electrical response (e.g., current pulse 116) in response to the incident modulated light 112. In some embodiments, light detector 104 is a photodiode that generates an electrical response to input modulated light. Signal conditioning circuit 106 filters/amplifies the electrical response generated by the light detector 104, as indicated by the signal conditioning circuit generating a higher amplitude output than that generated by the light detector 104. In some embodiments, the output of the signal conditioning circuit 106 is provided to a circuit and/or processor for additional processing.

Figure 2:
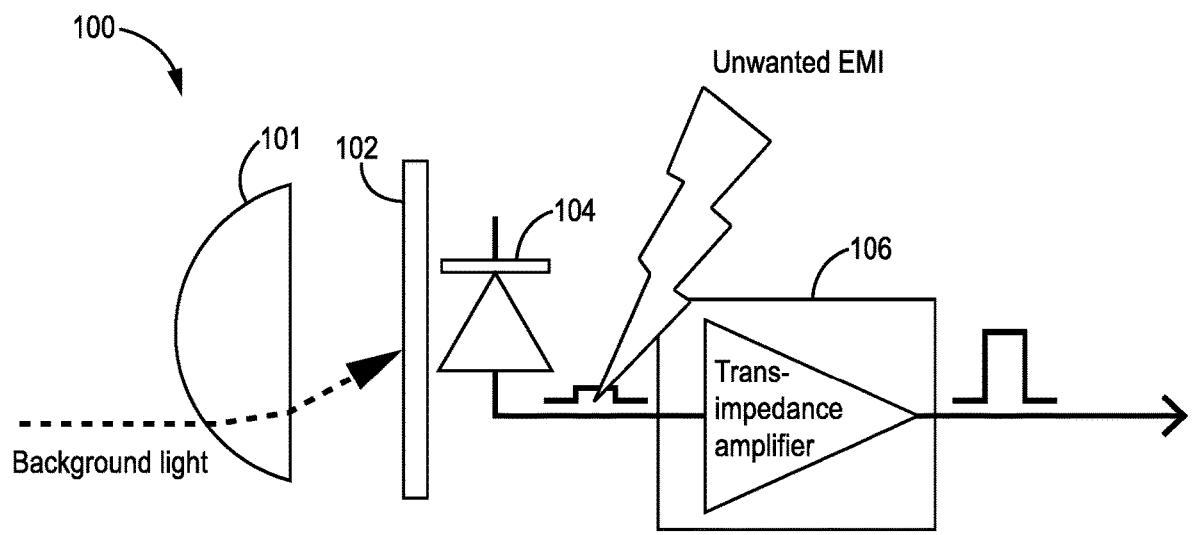
FIG. 2 is a simple view of a modulated light detection system as known in the prior art that responds to unwanted electromagnetic interference (EMI).

FIG. 2 illustrates the same modulated light detection system 100 as shown in FIG. 1, but illustrates a condition in which undesirable electromagnetic interference (EMI) generates an electrical response despite the lack of a modulated light signal. For example, in the embodiment shown in FIG. 2, only background light 110 is present, and is similarly filtered by filter 102. Despite the lack of any light incident to light detector 104, unwanted EMI 120 induces an electrical response (e.g., current pulse 118) along the signal path that includes light detector 104 and signal conditioning circuit 106. Unwanted EMI 120 may be generated by a number of different types of sources, including but not limited to broad-band electrical noise (e.g., that generated by spark gaps utilized in the spark plugs of gas engines), radar installations utilized at airports, collision avoidance systems, ballast utilized in fluorescent lights, power supply of an electrical appliance, etc.

In the simple diagram shown in FIG. 2, unwanted EMI is shown as simply originating within the circuit path between light detector 104 and signal conditioning circuit 106. However, unwanted EMI may enter the modulated light detection system 100 via a number of entry points and induce signals that may then be misinterpreted as indicating a detected modulated signal. For example, unwanted EMI may enter the system via power cables, the edges of exposed circuit cards, opening in the light collection optics and others, and may form unwanted signals within the photo-sensitive element, the wirebonds and package of the photo-sensitive element, the electrical traces on the application-specific integrated circuit (ASIC), the wires and pins and contacts that connect the printed circuit board to power, ground, user/operator, and between different parts of the system. Although EMI shielding and filtering may be utilized to prevent unwanted EMI from entering the signal path, it is extremely difficult to prevent all paths of unwanted EMI from entering the signal path.

Figure 3A:
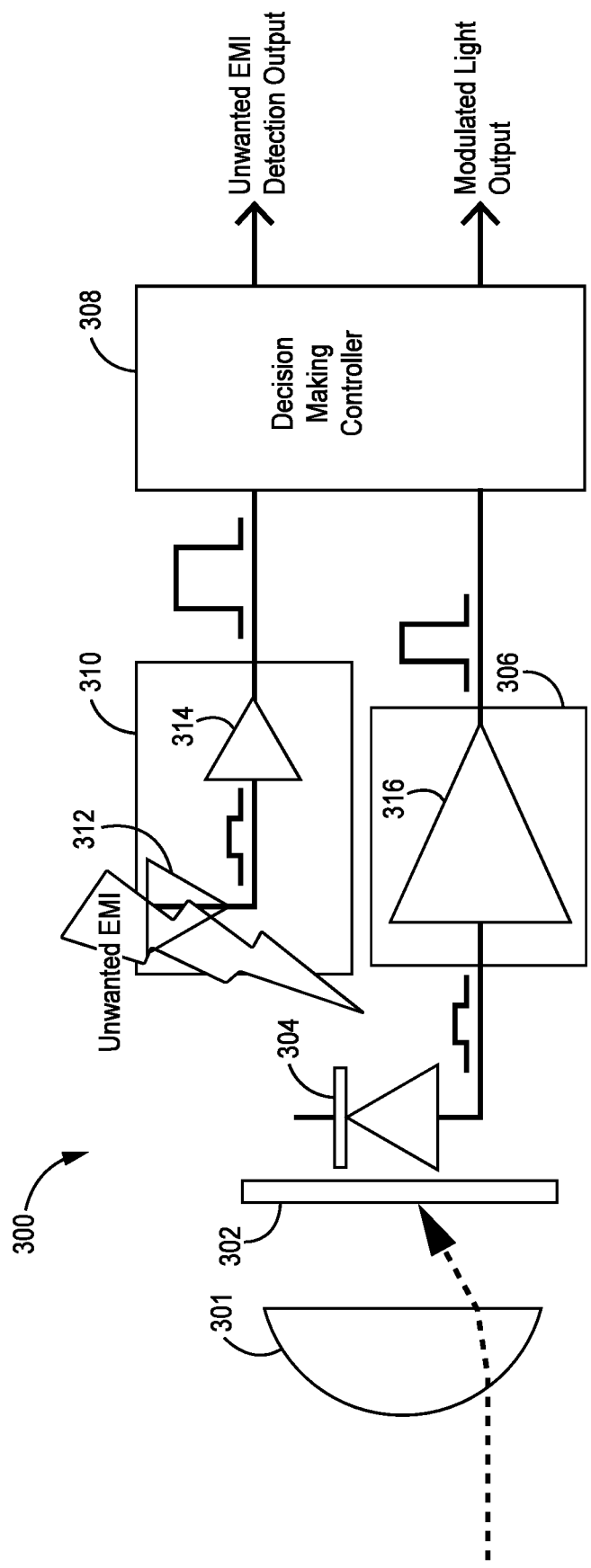
FIGS. 3A-3E are simple views of a modulated light detection system that includes electromagnetic interference (EMI) mitigation according to various embodiments of the present invention.

FIG. 3A is a simple view of a modulated light detection system 300 that includes electromagnetic interference (EMI) mitigation according to an embodiment of the present invention. In the embodiment shown in FIG. 3A, modulated light detection system 300 includes optical collector 301, optical filter 302, photo-sensitive element 304, signal conditioning circuit 306, decision-making controller 308, and EMI detection circuit 310. In general, EMI detection circuit 310 is configured to detect the presence of unwanted EMI 120 and in response generates a signal that is provided to decision-making controller 308. In the embodiment shown in FIG. 3A, no modulated light is incident on photo-sensitive element 304 and the background light that is present is filtered by filter 302 to prevent any light from being provided to light detector 304 as illustrated by the dashed line ending at filter 302. However, as described above with respect to FIG. 2, unwanted EMI generates a current pulse at some point within the chain of circuitry that includes photo-sensitive element 304, signal conditioning circuit 306 and/or decision-making controller 308. As a result, a signal is provided to decision-making controller 308 indicating—incorrectly—that a modulated light signal has been detected by photo-sensitive element 304. In the embodiment shown in FIG. 3A, EMI detection circuit 310 detects the unwanted EMI 310 and generates a signal provided to decision-making controller 308.

Decision-making controller 308 generates one or more outputs based on the modulated light signal provided by the photo-sensitive element 304 and signal conditioning circuit 306 and the EMI detection signal provided by the EMI detection circuit 310. Decision-making controller 308 and the functions performed may be implemented in hardware, firmware, software executed by a microprocessor, or combinations thereof. In some embodiments, based on the signal provided by EMI detection circuit 310, decision-making controller 308 generates an output indicating detection of unwanted EMI signals. In other embodiments, decision-making module 308 modifies the modulated light output generated by decision-making module 308. For example, in the event unwanted EMI is detected, then decision-making module 308 may nullify or "block" the modulated light output provided by decision-making circuit. In other embodiments, the modulated light output may be generated, but the output indicating detection of unwanted EMI signals may be utilized by downstream processing to determine the reliability to assign the modulated light output.

In some embodiments, EMI detection circuit 310 is sensitive to electromagnetic interference (EMI) signals that are in and near the same electrical bandwidth and EMI susceptibility range as the components included in the electrical signal chain utilized to detect modulated light, including photo-sensitive element 304 and signal conditioning circuit 306. In some embodiments, the EMI detection circuit 310 is tuned based on one or more of experimental results, knowledge regarding the optical and/or electrical bandwidth associated with the photo-sensitive element 304 and signal conditioning circuit 306. EMI susceptibility bandwidth, and/or tuning during operation. For example, photo-sensitive element 304 may operate within a given optical bandwidth (e.g., 300 nm to 1100 nm), while photo-sensitive element 304 and signal conditioning circuit 306 may operate within a given electrical bandwidth (e.g., 100 KHz to 1000 MHz). Knowledge of the optical and/or electrical bandwidths of the components utilized in the signal chain to detect modulated light signals may be utilized to determine the EMI bandwidths that may be able to induce a signal mis-identified as a modulated light signal within the given signal chain.

As discussed in more detail below, in some embodiments EMI detection circuit 310 comprises an antenna element 312 and an amplifier circuit 314 (e.g., utilized to amplify signals provided by the antenna element 312. In some embodiments, antenna element 312 can be tuned to provide sensitivity to electromagnetic signals that are in and near the same electrical bandwidth and EMI susceptibility range as the photo-sensitive element 304, signal conditioning circuit 306, and any other circuits associated with modulated light detection system 300. Amplifier circuit 314 may similarly be tuned to provide the desired amount of gain to signals generated by antenna element 312. For example, in some embodiments the gain associated with amplifier circuit 312 is selected to detect unwanted EMI signals that are strong enough to potentially induce an in-band response within the modulated light detection circuitry, including photo-sensitive element 304 and signal conditioning circuit 306. In some embodiments, antenna element 312 and amplifier circuit 314 are tuned prior to deployment and cannot be re-tuned in the field. In other embodiments, such as those described with respect to FIG. 3C, feedback within the modulated light detection system may be utilized to tune EMI detection circuit 310 as well as the chain of circuitry utilized to detect modulated light signals, including photo-sensitive element 304 and signal conditioning circuit 306.

Figure 3B:
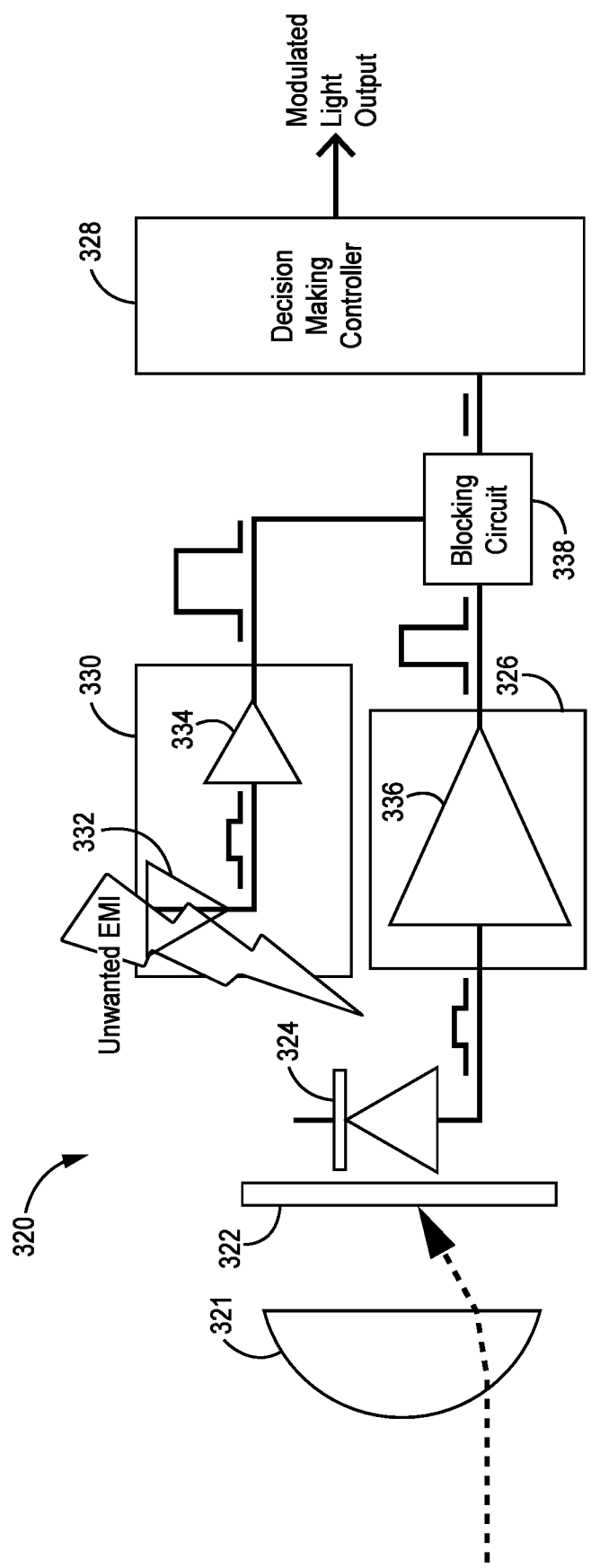

FIG. 3B is a simple view of a modulated light detection system 320 that includes electromagnetic interference (EMI) mitigation according to an embodiment of the present invention. In the embodiment shown in FIG. 3B, modulated light detection system 320 includes optical collector 321, optical filter 322, photo-sensitive element 324, signal conditioning circuit 326, decision-making controller 328. EMI detection circuit 330, and blocking circuit 338. In some embodiments, EMI detection circuit 330 includes antenna element 332 and amplifier circuit 334. Similarly, in some embodiments, signal conditioning circuit 326 includes transimpedance amplifier 336, as well as other circuitry.

The embodiment shown in FIG. 3B operates in generally the same way as the embodiment shown in FIG. 3A, wherein EMI detection circuit 330 is configured to detect the presence of unwanted EMI and generates a signal in response to detected EMI. However, in the embodiment shown in FIG. 3B, rather than provide the signal indicative of the detected EMI signal to decision-making controller 328, the signal is provided to blocking circuit 338. In this embodiment, blocking circuit 338 is included in the chain of circuitry that includes photo-sensitive element 324 and signal conditioning circuit 326. In the embodiment shown in FIG. 3B, blocking circuit 338 is coupled between signal conditioning circuit 336 and decision-making controller 328. However, in other embodiments blocking circuit 338 may be located at various points along the chain of circuitry responsible for detecting modulated light. In the embodiment shown in FIG. 3B, blocking circuit 338 acts to block detected modulated light signals from being propagated to decision-making controller 328 if unwanted EMI signals are detected. In this embodiment, decision-making controller 328 is not required to determine whether a detected modulated light signal should be ignored due to the presence of detected EMI. Rather, decision-making controller 328 may be configured to interpret any signals received from blocking circuit 338 as indicative of a modulated light signal. In other embodiments, blocking circuit 338 may be implemented by decision-making controller 328, and no external blocking circuit is utilized separate from the decision-making controller 328. In embodiments in which the function of the blocking circuit 338 is implemented by decision-making controller 328, then the signal indicative of the detected EMI signal is provided to decision-making controller 328.

Figure 3C:
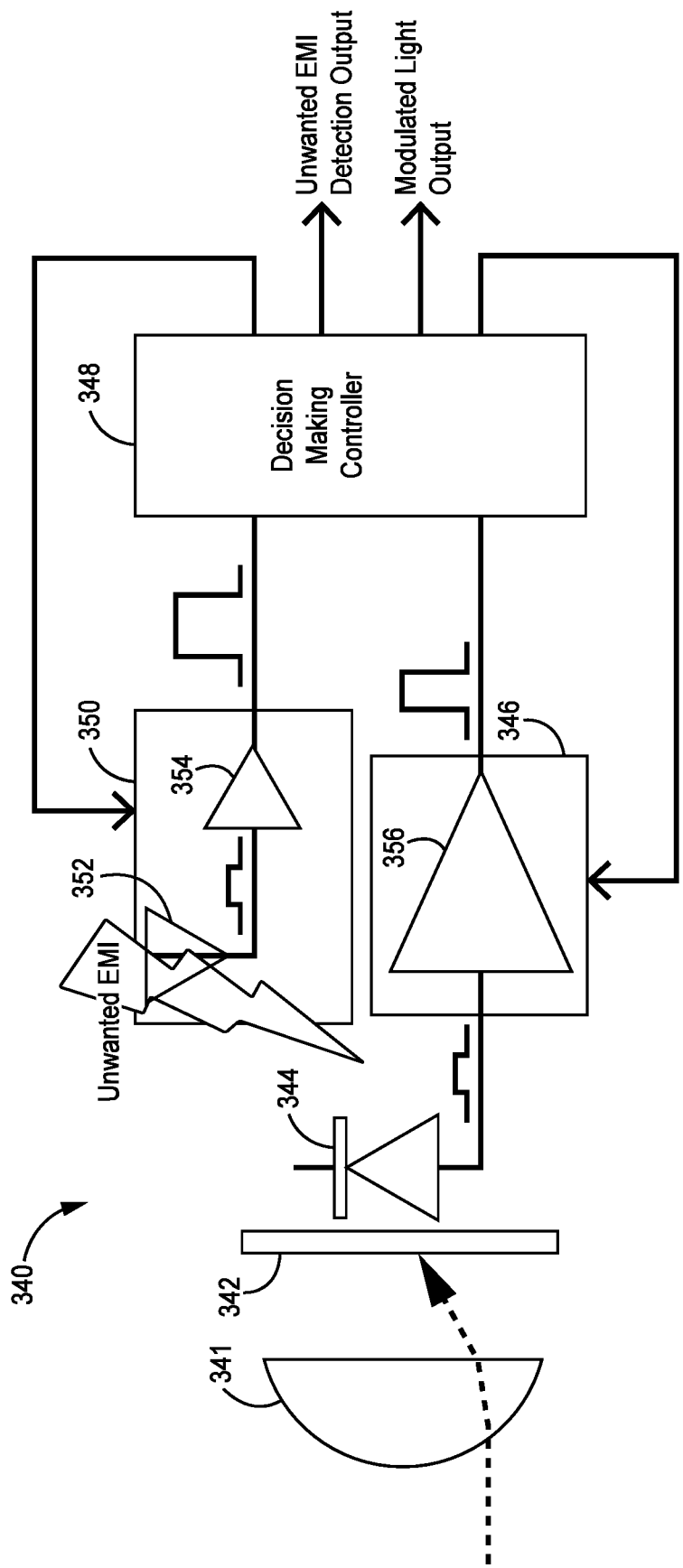

FIG. 3C is a simple view of a modulated light detection system 340 that includes electromagnetic interference (EMI) mitigation according to an embodiment of the present invention. In the embodiment shown in FIG. 3C, modulated light detection system 340 includes optical collector 341, optical filter 342, photo-sensitive element 344, signal conditioning circuit 346, decision-making controller 348, and EMI detection circuit 350. In some embodiments. EMI detection circuit 330 includes antenna element 352 and amplifier circuit 354. Similarly, in some embodiments, signal conditioning circuit 346 includes transimpedance amplifier 356, as well as other circuitry.

The embodiment shown in FIG. 3C operates in generally the same way as the embodiments shown in FIG. 3A and FIG. 3B, wherein EMI detection circuit 350 is configured to detect the presence of unwanted EMI and generates a signal in response to detected EMI. In the embodiment shown in FIG. 3C, decision-making controller 348 generates an output in response to detected unwanted EMI that is provided as feedback to the one or more of the photo-sensitive element 344, signal conditioning circuit 346 and/or EMI detection circuit 350. In one embodiment, in response to detected unwanted EMI, decision-making controller 348 generates a feedback signal provided to signal conditioning circuit 346 that causes signal conditioning circuit 346 to modify one or more parameters associated with signal conditioning provided. For example, in some embodiment the signal conditioning circuit 346 provides a gain function to increase the amplitude of electrical signals provided by the photo-sensitive element 344. In this example, the feedback provided to signal conditioning circuit 346 may result in signal conditioning circuit 346 reducing the gain provided to the signal, such that unwanted EMI will not be amplified to level sufficient for the signal to be mis-identified as a modulated light signal. In some embodiments, other parameters of signal conditioning circuit may be modified, such as increasing filtering provided by signal conditioning circuit 346 (or filtering provided in other parts of the signal chain) to filter signals corresponding to unwanted EMI. In some embodiments, the bandwidth in which the photo-sensitive element 344 and signal conditioning circuit 346 operate is modified to avoid the bandwidth associated with the detected unwanted EMI. For example, in the presence of intentional electronic jamming (a form of unwanted EMI), it may be beneficial to change the operating bandwidth of the system to avoid the bandwidth associated with the intentional jamming.

In some embodiments, feedback may also be provided to EMI detection circuit 350 to modify the operation of EMI detection circuit 350. In some embodiments, decision-making controller 348 may utilize feedback to control the operation of the EMI detection circuit 350. As discussed above. EMI detection circuit 350 generates an electrical signal in response to EMI that has an amplitude and frequency sufficient to induce a signal in the signal chain utilized to detect modulated light. Conversely, no electrical signal should be generated by EMI detection circuit 350 is the amplitude and frequency of the EMI is insufficient to induce a signal in the signal chain utilized to detect modulated light. In addition, the EMI detection circuit 350 should be configured to generate no signal or at least a different signal in response to modulated light (i.e., not EMI) for which the modulated light detection system is intended to detect. In some embodiments, in response to EMI detection circuit 350 generating a signal indicating detection of unwanted EMI—without a corresponding signal being detected in the signal chain utilized to detect modulated light—this indicates that the EMI detection circuit 350 is too sensitive (i.e., is detecting EMI that is not of a sufficient amplitude or frequency to induce a signal in the modulated light signal chain). In response, decision-making controller 348 may modify one or more parameters of the EMI detection circuit 350 (e.g., gain) to reduce the EMI detection circuits 350 sensitivity to EMI. In other embodiments, if the operating bandwidth of the modulated light signal chain (e.g., photo-sensitive element 344 and signal conditioning circuit 346) is modified through feedback provided by decision-making controller 348, then it may be desirable to also modify the operating bandwidth of EMI detection 350. That is, if the operating bandwidth of the modulated light signal chain is modified, then the bandwidth of EMI that may result in the false detection of a modulated light signal may change as well, requiring EMI detection circuit 350 to be modified to detect EMI in the same bandwidth that will affect the modulated light signal chain.

Figure 3D:
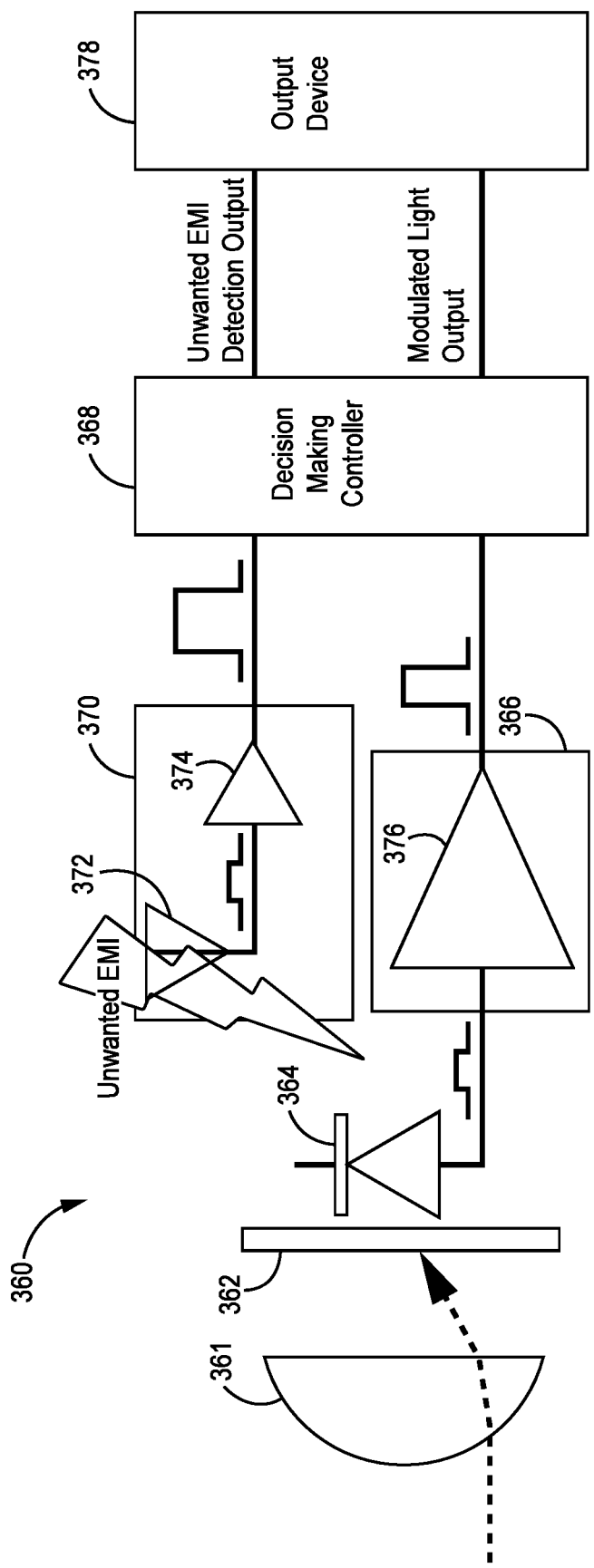

FIG. 3D is a simple view of a modulated light detection system 360 that includes electromagnetic interference (EMI) mitigation according to an embodiment of the present invention. In the embodiment shown in FIG. 3D, modulated light detection system 360 includes optical collector 361, optical filter 362, photo-sensitive element 364, signal conditioning circuit 366, decision-making controller 368, EMI detection circuit 370, and output device 378. In some embodiments, EMI detection circuit 370 includes antenna element 372 and amplifier circuit 374. Similarly, in some embodiments, signal conditioning circuit 366 includes transimpedance amplifier 376, as well as other circuitry.

The embodiment shown in FIG. 3D operates in generally the same way as the embodiments shown in FIGS. 3A-3C, wherein EMI detection circuit 370 is configured to detect the presence of unwanted EMI and generate a signal in response to detected EMI.

In the embodiment shown in FIG. 3D, decision-making controller 368 is connected to provide one or more outputs to output device 378 and may include one or more of the modulated light output and EMI detection output. In some embodiment, output device 378 may provide information to a user in response to detected modulated light signals. For example, in some embodiments output device 378 provides an indication to a user that modulated light has been detected, wherein the indication may be in the form of a light signal, an audio signal, a digital communication signal, a haptic signal (e.g., vibrating component), and/or any other means of alerting an operator to the detection of modulated light. In other embodiments, decision-making controller 368 may interpret the received modulated light signal and may provide instructions to the user device in response to the received information. For example, in some embodiments the modulated light signal is utilized by decision-making controller to determine distance between objects, wherein the output provided to output device 378 may be based on this information. In still other embodiments, the information derived from the modulated light signal is provided to output device 378, which utilizes the information to make decisions. Depending on the application, in some embodiments decision-making controller 368 communicates the detection of unwanted EMI to output device 378. For example, in some embodiments the determination of whether to rely on the detected modulated light signal is made by decision-making controller 368 based, at least in part, on whether unwanted EMI signals were detected by EMI detection circuit 370. In these embodiments, it may not be necessary to communicate the unwanted EMI detection output to output device 378. In other embodiments, output device 378 may make use of information indicating that unwanted EMI has been detected. For example, in the presence of electronic jamming, the output device 378 may generate a notification to a user regarding the detected presence of unwanted EMI (e.g., electronic jamming). In other embodiments, the indication that unwanted EMI has been detected may be utilized by output device 372 to gauge the reliability of the modulated light output received from decision-making controller 368. For example, in response to detected EMI the output device 372 may discount information provided via modulated light output but may benefit from still receiving information relayed by the modulated light output. In some embodiments, the output generated by output device 378 is modified in response to detected EMI. For example, the output generated by output device 378 may be audio, visual, digital data communication, and/or haptic in response to detected modulated light. Modification of the output may include modifying one or more of these outputs. For example, modifying a visual output may include changing the color of the visual output, changing whether the output is constant/blinking, or changing the frequency of the blinking. Modifying an auditory output may include modifying the amplitude, frequency, or type of sound generated by the output device 378. Modifying a haptic output may include modifying amplitude, frequency, or type of vibration generated by the output device 378. Modifying the digital communication may include modifying the system status communicated.

Figure 3E:
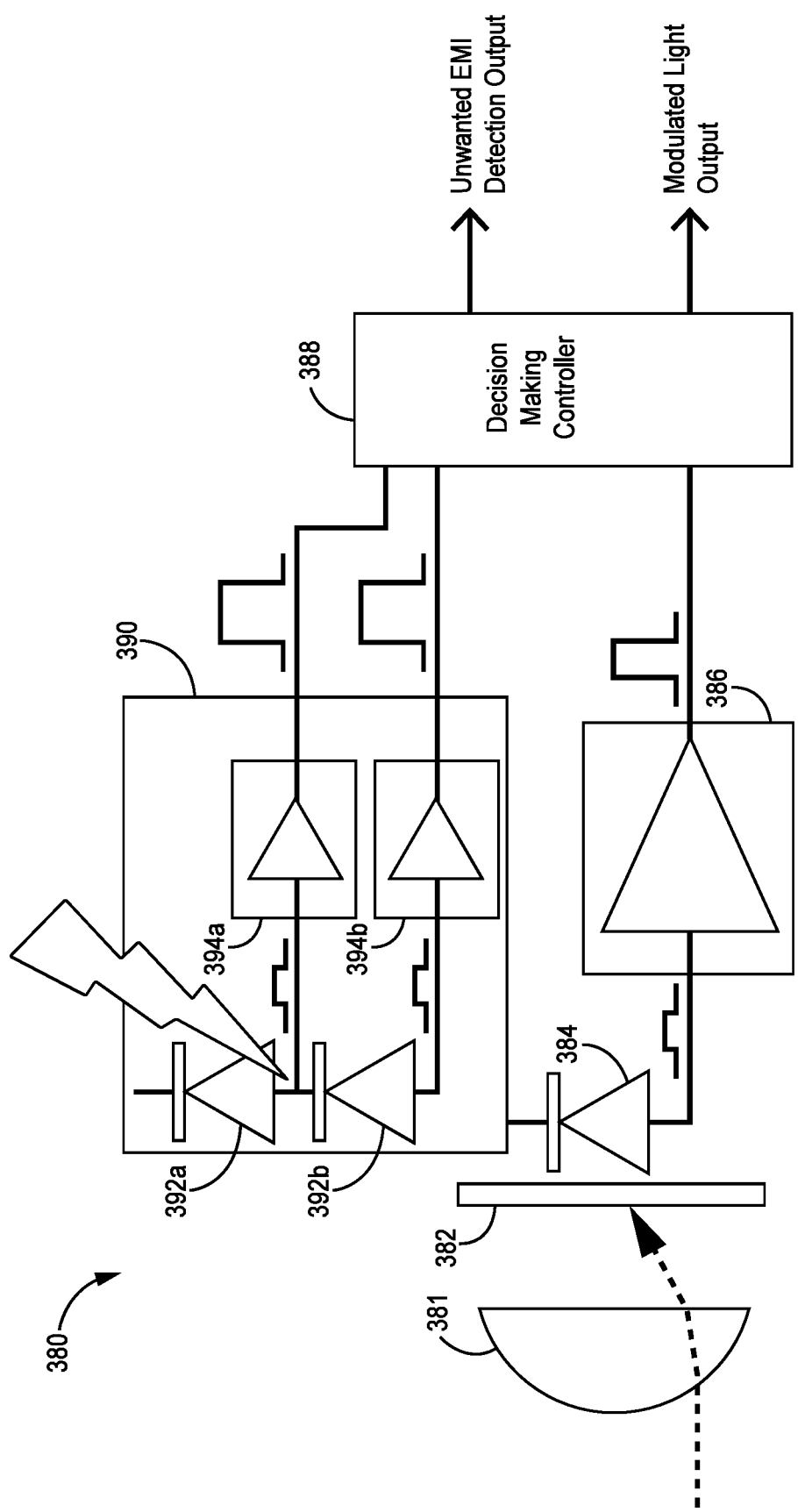

FIG. 3E is a simple view of a modulated light detection system 380 that includes electromagnetic interference (EMI) mitigation according to an embodiment of the present invention. In the embodiment shown in FIG. 3E, modulated light detection system 380 includes optical collector 381, optical filter 382, photo-sensitive element 384, signal conditioning circuit 386, decision-making controller 388, and EMI detection circuit 390. In some embodiments, EMI detection circuit 390 includes one or more photo-sensitive elements 392a and 392b and signal conditioning circuits 394a and 394b. In contrast with the embodiments shown in FIGS. 3A-3D, the EMI detection circuit 390 utilizes one or more photo-sensitive elements 392a and 392b that differ from photo-sensitive element 384 in one or more of wavelength of sensitivity, direction of sensitivity, signal type or sensitivity, or a combination therefore. As a result, in response to modulated light intended from photosensitive element 384, only photo-sensitive element 384 generates an electrical signal, while photo-sensitive elements 392a and 392b do not generate an electrical response. However, if an EMI event of sufficient strength occurs, multiple photo-sensitive signal chains (e.g., signal chain including photo-sensitive element 392a and signal conditioning 394a) will respond in addition to photo-sensitive element 384. Therefore, in instances in which multiple signal chains generate a response, decision-making controller 388 determines that the source of the plurality of signals is unwanted EMI and not a modulated light signal. That is, the only way for more than one channel to generate a response at the same time is if unwanted EMI is the source of the detection event. In this way, the embodiment shown in FIG. 3E illustrates utilization of a photo-sensitive detection channel in place of the RF antenna/detector shown in FIGS. 3A-3D.

In the embodiments described with respect to FIGS. 3A-3E, optical collector 301, 321, 341, 361, and/or 381 may be optionally utilized to collect optical signals. Likewise, optical filter 302, 322, 342, 362 and/or 382 may be optionally utilized to block or filter certain types of light from reaching photo-sensitive elements 304, 324, 344, 364 and 384, respectively. In some embodiments, filters 302, 322, 342, and/or 362 may include one or more interference filters, polarizers, absorptive filters or combinations thereof. In some embodiments, photo-sensitive elements 304, 324, 344, 364 and/or 384 may include one or more photodetectors and/or photoconductors configured to generate an electrical signal in response to incident light. In some embodiments, photo-sensitive elements 304, 324, 344, 364 and/or 384 is located on a printed circuit board (PCB, not shown) and in electrical communication with the PCB, wherein electrical signals generated by the photo-sensitive element 304, 324, 344, 364 and/or 384 are communicated to signal conditioning circuit 306, 326, 346, 366 and/or 386, respectively. In some embodiments, the signal conditioning circuit and/or decision-making controller 308, 328, 348, 368 and/or 388 may also be located on the PCB. In other embodiments, one or more of photo-sensitive elements 304, 324, 344, 364 and/or 384, signal conditioning circuit 306, 326, 346, 366 and/or 386 and/or decision-making controller 308, 328, 348, 368 and/or 388 may be implemented on an application specific integrated circuit (ASIC).

In some embodiments, signal conditioning circuits 306, 326, 346, 366 and/or 386 provides one or more functions on the signal provided by photo-sensitive elements 304, 324, 344, 364 and/or 384, respectively, and the functions provided may vary on the application. For example, functions performed by the signal conditioning circuits may include one or more of current-to-voltage conversion, signal amplifications, signal mixing, signal filtering, signal multiplexing and demultiplexing, attenuation, sampling, analog-to-digital conversion, comparators, and others. In general, the signal conditioning circuits 306, 326, 346, 366 and/or 386 are utilized to convert the electrical signal (e.g., current pulse) produced by the photosensitive elements into an electrical signal that can be utilized by decision-making controller 308, 328, 348, 368 and/or 388, respectively, to make decisions based on the modulated light detected. Depending on the application, the signal conditioning circuits 306, 326, 346, 366 and/or 386 and/or decision-making controllers 308, 328, 348, 368 and/or 388, respectively, may be configured to detect one or more parameters associated with modulated light detected by the photo-sensitive elements, such as relative or absolute frequency of the modulated light with respect to a reference source or a time-delayed version of the emission from the same modulated light source, pulse strength of the modulated light source, polarization of the modulated light source, pulse width of the modulated light source, arrival time of the modulated light source, or parameters in a series of received modulated light signals. As discussed above, depending on the application, decision-making module may provide a variety of outputs related to the detected modulated light signal. In some embodiments, decision-making controllers 308, 328, 348, 368 and/or 388 is an analog and/or digital circuit configured to detect one or more parameters associated with the modulated light signal based on the signal received from signal conditioning circuits 306, 326, 346, 366 and/or 386 and to make decisions regarding how to interpret the received signal. In embodiments in which decision-making module 308 is implemented with digital circuits, decision-making controller 308, 328, 348, 368 and/or 388 may include microprocessors, field-programmable gate arrays (FPGAs), microcontrollers, etc. In embodiments in which decision-making controllers 308, 328, 348, 368 and/or 388 are implemented with digital circuitry, then the signal provided by the respective signal conditioning circuits and EMI detection circuits must be a digital signal. In embodiments in which decision-making controllers 308, 328, 348, 368 and/or 388 are implemented with analog circuitry or a combination of analog and digital circuitry, then the signal provided by the respective signal conditioning circuits and EMI detection circuits may be an analog signal.

Figure 4:
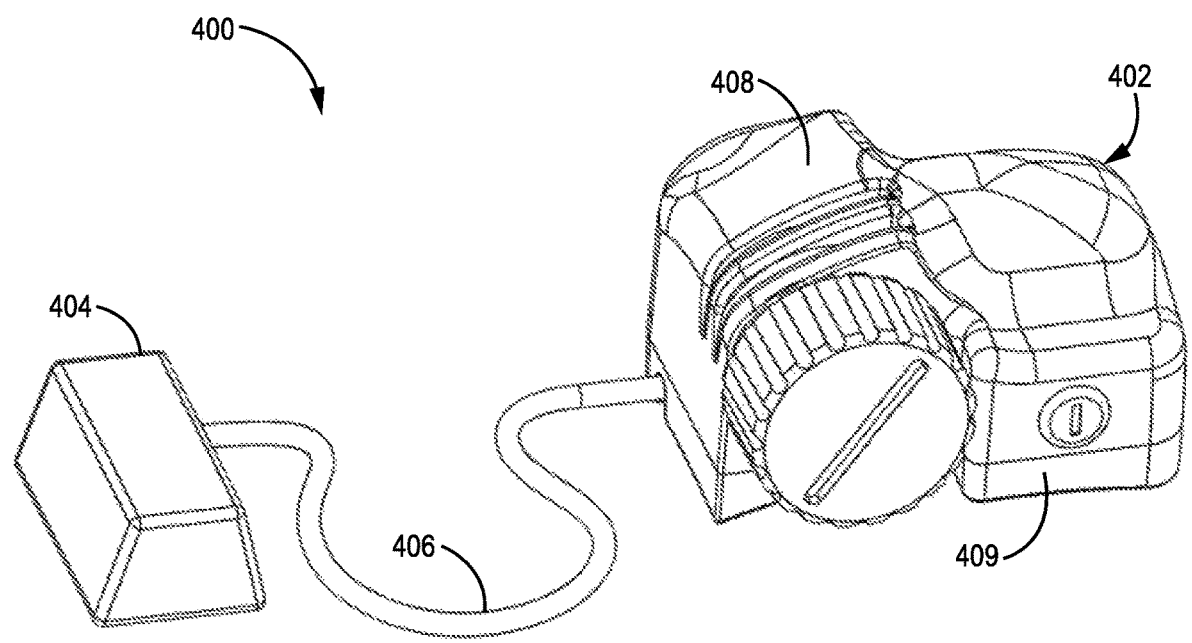
FIG. 4 is a perspective view of a wearable laser warning receiver system utilizing EMI mitigation according to some embodiments of the present invention.

FIG. 4 is a perspective view of a wearable laser warning receiver system 400 utilizing EMI mitigation according to an embodiment of the present invention. In the embodiment shown in FIG. 4, wearable laser warning receiver system 400 includes modulated light detection system 402 and vibrating haptic motor 404 located at the end of a cable 406 extending from modulated light detection system 402. Circuitry and electronics associated with the modulated light detection system 402 are enclosed within a space defined by upper cover 408 and lower cover 409. In some embodiments, in response to a detected modulated light signal (e.g., for example, indicating presence of a laser targeting system), a signal is provided to vibrating haptic motor 404 worn by the operator (e.g. soldier) to alert the operator of the presence of the laser targeting system. This serves as an alert to the operator that the operator or surrounding area may be targeted by a laser targeting system. In response, the operator may initiate counter-measures to defeat the laser targeting system. It is therefore undesirable to generate false alarms in response to unwanted EMI signals, which may result in the operator taking action that is not warranted or to release countermeasures when no threat is present. To prevent unwanted EMI from generating an alert provided to the vibrating haptic motor 404, an EMI detection circuit is employed as part of modulated light detection system 402, as described with respect to FIGS. 5-7 below.

In some embodiments, the wearable laser warning receiver system 400 is worn by an operator, for example affixed to a helmet. The vibrating haptic motor 404 is similarly affixed to the operator to allow the operator to feel vibration or hear the audio associated with the vibration generated by vibrating haptic motor 404.

Figure 5:
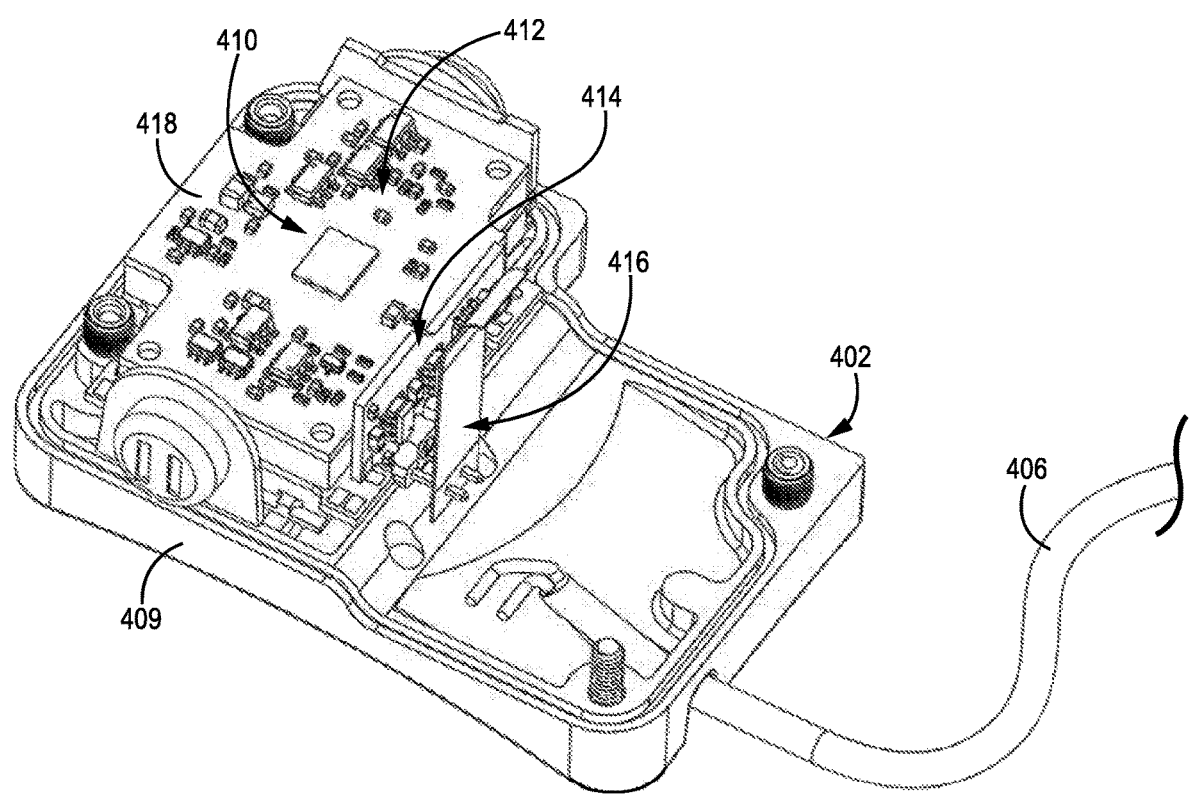
FIG. 5 is a perspective view of the wearable laser warning receiver system shown in FIG. 4 in which the cover has been removed to illustrate components included in the wearable laser warning receiver system according to some embodiments of the present invention.

In the view shown in FIG. 5, top cover 408 (shown in FIG. 4) has been removed to illustrate components located within, which include optical receiver 410, signal conditioning circuit 412, RF detection board 414, flexible antenna 416, and first PCB 418. In the view shown in FIG. 6, first PCB 418 is removed (along with components connected thereto) to illustrate second PCB 420 and components mounted thereon, including microprocessor 422. In the view shown in FIG. 7, EMI shielding 430 is shown surrounding the circuit elements shown in FIGS. 5 and 6.

In the embodiment shown in FIG. 5, optical receiver 410 and signal conditioning circuit 412 are located on a first printed circuit board (PCB) 418. In the embodiment shown in FIG. 6, microprocessor 422 is located on second PCB 420. First PCB 418 is in electrical communication with second PCB 420, allowing signals generated by one or more of optical receiver 410, signal conditioning circuit 412. RF detection board 414, and flexible antenna 416 to be communicated to microprocessor 422. Second PCB 420 is in electrical communication with wires 424 to provide signals to vibrating haptic motor 404.

Figure 6:
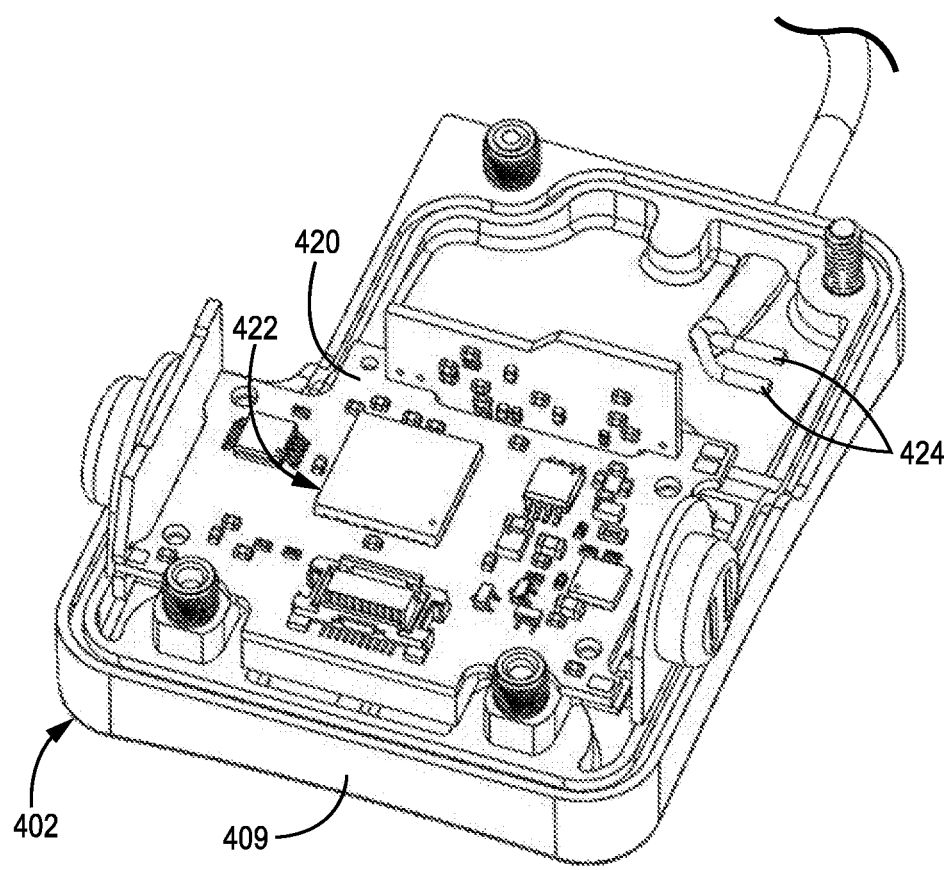
FIG. 6 is a perspective view of the wearable laser warning receiver system shown in FIGS. 4 and 5 in which the top cover and first printed circuit board have been removed to illustrate components included in the wearable laser warning receiver system according to some embodiments of the present invention.
Figure 7:
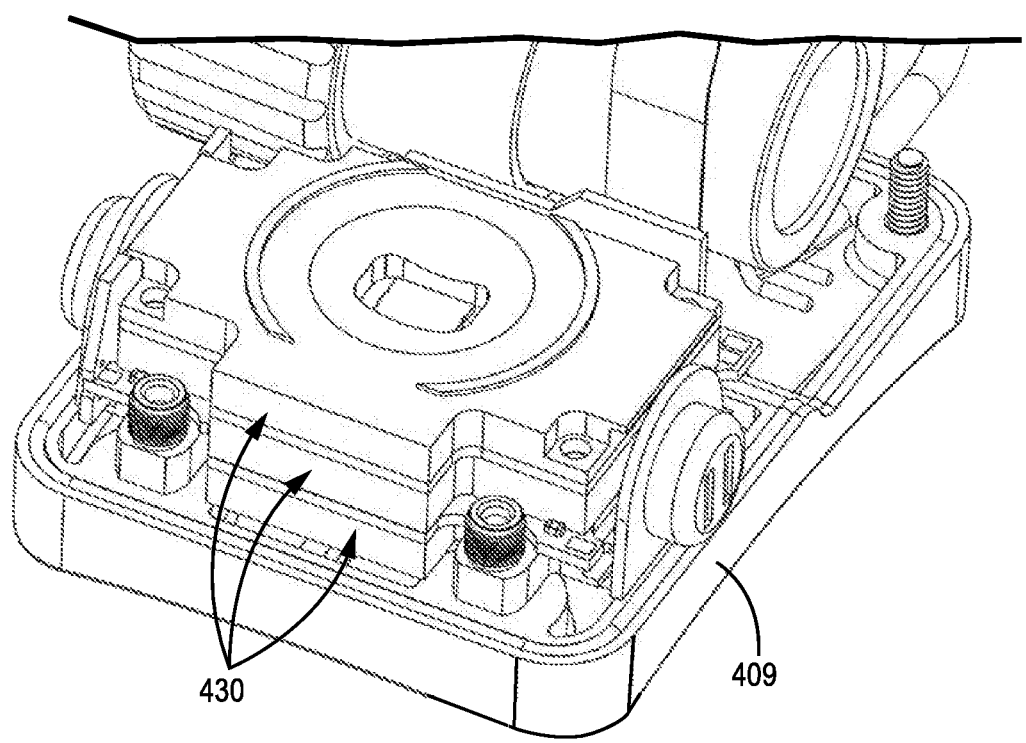
FIG. 7 is a perspective view of the wearable laser warning receiver system shown in FIGS. 4-6 in which the cover has been removed to illustrate shielding included around components within the wearable laser warning receiver system according to some embodiments of the present invention.

In the embodiment shown in FIGS. 5 and 6, optical signals incident on optical receiver 410 are converted to an electrical signal that is provided to signal conditioning circuit 412. Optical receiver 410 may include one or more optical collectors, optical filters, and/or photo-sensitive elements designed to collect and measure a particular type of modulated light. However, as discussed above, unwanted EMI may induce electrical signals within the signal path including components associated with optical receiver 410 and signal conditioning circuit 412 that could be misinterpreted as modulated light signals. The risk of EMI in generating false positives is mitigated by the inclusion of EMI detection circuit, which includes flexible antenna 416 and RF detection board 414. In some embodiments, flexible antenna 416 includes two wires configured to detect EMI within the bandwidth likely to induce electrical signals in the modulated light signal path, wherein RF detection board 414 conditions the detected signal (e.g., provides amplification, filtering, etc.). In some embodiments, EMI signals detected by flexible antenna 416 and RF detection board 414 are provided to microprocessor 422, along with signals generated by optical receiver 410 and signal conditioning circuit 412. In response to the received signals, microprocessor 422 makes a determination regarding the output to be provided to vibrating haptic motor 404. For example, if a modulated light signal is detected in the absence of an unwanted EMI signal, then the microprocessor 422 may generate an output provided to vibrating haptic motor 404 causing it to vibrate and alert the operator of the detected modulated light signal. Conversely, if an unwanted EMI signal is detected by flexible antenna 416 and RF detection board 414, then no signal is generated by microprocessor 422 regardless of whether a modulated light signal is detected or not.

As discussed above, in some embodiments the flexible antenna 416 and RF detection board 414 are tuned to generate a signal in response to unwanted EMI likely to generate a response in the signal chain associated with optical receiver 410 and signal conditioning circuit 412. That is, in some embodiments, the bandwidth of unwanted EMI signals detected by EMI detection circuit is coextensive with the bandwidth of unwanted EMI signals that are likely to result in the generation of a signal within the signal chain associated with optical receiver 410 and signal conditioning circuit 412.

In some embodiments, an additional blocking circuit may be included in the signal chain that includes optical receiver 410, signal conditioning circuit 412 and microprocessor 422, wherein the blocking circuit is configured to prevent communication of a detected modulated light signal in response to an unwanted EMI signal detected by the EMI detection circuit.

In some embodiments, one or more of optical receiver 410 and signal conditioning circuit 412 receive feedback from microprocessor 422 to allow one or more parameters of the signal path to be modified in response to detected EMI. For example, this may include reducing the gain associated with signal conditioning circuit 412, changing the operating bandwidth of the optical receiver 410 and/or signal conditioning circuit to avoid the unwanted EMI detected, and/or modify the filtering provided by signal conditioning circuit 412.

Figure 8:
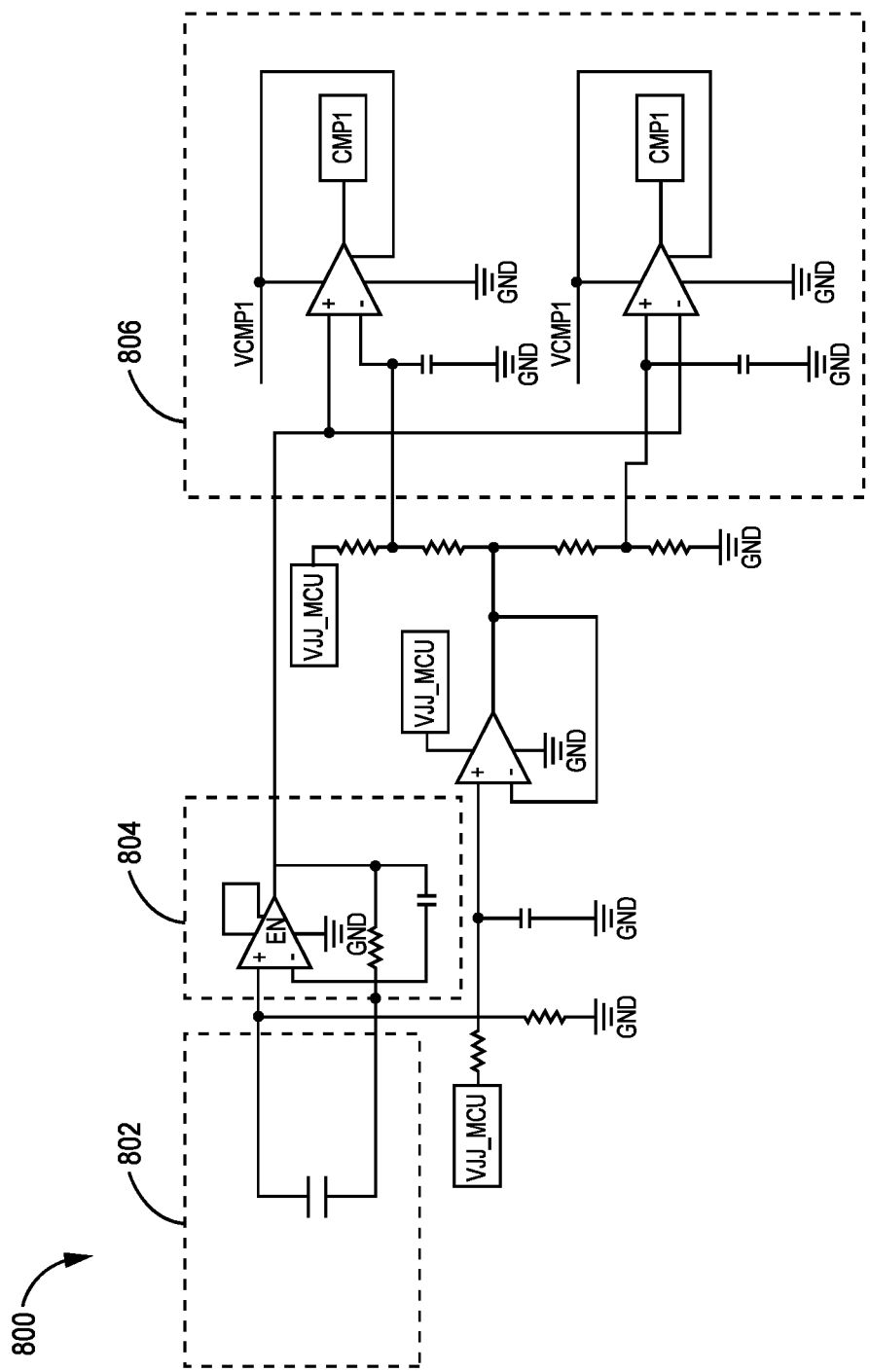
FIG. 8 is a circuit diagram of an EMI detection circuit according to some embodiments of the present invention.

FIG. 8 is a circuit diagram of EMI detection circuit 800 according to an embodiment of the present invention. In the embodiment shown in FIG. 8. EMI detection circuit 800 includes antenna 802, amplification circuit 804, and comparator/threshold circuit 806. In the embodiment shown in FIG. 8, antenna 802 includes a pair of leads (e.g., wires) having a defined length and defined separation between the leads, along with a capacitor. The length of the leads, separation, and capacitor defines a bandwidth or operating frequency of the antenna 802. The output of antenna 802 is provided to amplification circuit 804, which amplifies the signal provided by antenna 802. The output of amplification circuit 804 is provided to comparator circuit 806. In the embodiment shown in FIG. 8, the comparator circuit 806 generates a logic high output when the signal provided by the amplification circuit 804 exceeds a threshold level and a logic low output when the signal provided by the amplification circuit is below a threshold level. In this way, the comparator circuit 806 provides a digital output that can be provided to a microprocessor.

While the invention has been described with reference to an exemplary embodiment(s), it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A modulated light receiver comprising:
   a photo-sensitive element configured to generate an electrical signal in response to modulated light;
   an electromagnetic interference (EMI) detection circuit configured to generate an electrical signal in response to EMI;
   a decision-making controller electrically coupled to the photo-sensitive element and the EMI detection circuit, wherein the decision-making controller generates one or more outputs based on the inputs received from the photo-sensitive element and the EMI detection circuit; and
   a blocking circuit that receives an input from the EMI detection circuit, wherein the blocking circuit prevents generation of at least one of the outputs indicating detection of modulated light if the EMI detection circuit provides an electrical signal indicating detected EMI.

2. The modulated light receiver of claim 1, wherein the decision-making controller generates an EMI detection output indicating whether EMI was detected by the EMI detection circuit.

3. The modulated light receiver of claim 1, wherein the output generated by the decision-making controller includes a modulated light output that provides information related to detected modulated light and an EMI output that provides information related to detected EMI.

4. The modulated light receiver of claim 1, further including a signal conditioning circuit that provides one or more signal conditioning functions to the electrical signal generated by the photo-sensitive element.

5. The modulated light receiver of claim 4, wherein the photo-sensitive element and the signal conditioning circuit operate within a bandwidth.

6. The modulated light receiver of claim 5, wherein the EMI detection circuit is tuned to generate an electrical signal in response to EMI likely to generate an electrical signal in one or more of the photo-sensitive elements and the signal conditioning circuit.

7. The modulated light receiver of claim 5, wherein one or more of bandwidth and/or gain associated with the photo-sensitive element and/or the signal conditioning circuit is modified based on feedback provided by the decision-making controller in response to detected EMI.

8. The modulated light receiver of claim 1, further comprising an output device coupled to receive the output generated by the decision-making controller.

9. A laser warning receiver system comprising:
   a detection system that includes a modulated light detection circuit and an electromagnetic interference (EMI) detection circuit; and
   an output device connected to the modulated light detector, wherein in response to modulated light detected by the modulated light detection circuit an output is generated at the output device and wherein in response to EMI detected by the EMI detection circuit the output is modified, wherein modification of the output in response to EMI detected by the EMI detection circuit includes modifying one or more of an audio, visual, digital communication, and/or haptic output generated by the output device from an output generated in response to detected modulated light.

10. The laser warning receiver system of claim 9, wherein the modulated light detection circuit includes a photo-sensitive element and a signal conditioning circuit configured to generate an electrical response to modulated light incident on the photo-sensitive element.

11. The laser warning receiver system of claim 10, wherein the EMI detection circuit is tuned to generate an electrical response to EMI within a bandwidth likely to induce an electrical response in a signal chain that includes the photo-sensitive element and the signal conditioning circuit.

12. The laser warning receiver system of claim 11, wherein the EMI detection circuit includes an antenna element and an amplifier circuit for generating an electrical response to EMI.

13. The laser warning receiver system of claim 9, wherein the detection system further includes a decision-making controller connected to receive inputs from the modulated light detection circuit and the EMI detection circuit, wherein the decision-making controller provides an output to the output device based on the received inputs.

14. The laser warning receiver system of claim 13, wherein the decision-making controller is a microprocessor.

15. The laser warning receiver system of claim 10, wherein the detection system is a wearable device.

16. The laser warning receiver system of claim 12, wherein the output device is a vibrating haptic motor worn by an operator.

17. A laser warning receiver system comprising:
a detection system that includes a modulated light detection circuit and an electromagnetic interference (EMI) detection circuit, wherein the modulated light detection circuit includes a photo-sensitive element and a signal conditioning circuit configured to generate an electrical response to modulated light incident on the photo-sensitive element, and wherein the EMI detection circuit includes one or more photo-sensitive elements and one or more signal conditioning circuits, wherein the one or more photo-sensitive elements included in the EMI detection circuit differs from the photo-sensitive element included in the modulated light detection circuit in one or more of wavelength of sensitivity, direction of sensitivity, signal type or sensitivity, or a combination therefore; and
an output device connected to the modulated light detector, wherein in response to modulated light detected by the modulated light detection circuit an output is generated at the output device and wherein in response to EMI detected by the EMI detection circuit the output is modified.

18. The modulated light receiver of claim 1, wherein the blocking circuit is implemented by the decision-making controller.

19. The modulated light receiver of claim 2, wherein the EMI detection output generated by the decision-making controller identifies whether the EMI was detected in the presence of a modulated light signal.

* * * * *